United States Patent
Yamamoto et al.

(10) Patent No.: US 6,541,122 B2
(45) Date of Patent: Apr. 1, 2003

(54) ROLL OF METAL FILM/AROMATIC POLYIMIDE FILM COMPOSITE WEB

(75) Inventors: Tomohiko Yamamoto, Yamaguchi (JP); Katsumi Kato, Yamaguchi (JP); Toshinori Hosoma, Yamaguchi (JP)

(73) Assignee: Ube Industries, Ltd., Yamaguchi (JP)

( * ) Notice: Subject to any disclaimer, the term of this patent is extended or adjusted under 35 U.S.C. 154(b) by 0 days.

(21) Appl. No.: 09/818,798

(22) Filed: Mar. 27, 2001

(65) Prior Publication Data
US 2001/0055691 A1 Dec. 27, 2001

(30) Foreign Application Priority Data

Mar. 28, 2000 (JP) ........................................ 2000-088278
Mar. 28, 2000 (JP) ........................................ 2000-088279

(51) Int. Cl.[7] ........................ B32B 27/00; B32B 27/08; B32B 15/08
(52) U.S. Cl. ..................... 428/473.5; 428/458; 428/216
(58) Field of Search ............................. 428/458, 473.5, 428/216

(56) References Cited

U.S. PATENT DOCUMENTS 4,543,295 A * 9/1985 St. Clair et al. .......... 426/473.5
4,599,128 A * 7/1986 Held ........................... 156/322
6,319,597 B1 * 11/2001 Yamaguchi et al. ........ 428/216

\* cited by examiner

Primary Examiner—P. Hampton-Hightower
(74) Attorney, Agent, or Firm—Reed Smith LLP

(57) ABSTRACT

A roll of a web composed of an aromatic polyimide composite film and a metal film in which the polyimide composite film is composed of a non-thermoplastic aromatic polyimide base film and a thermoplastic aromatic polyimide cover film, the polyimide composite film showing a heat shrinkage ratio of less than 0.1% at 300° C., can be produced by heating a corresponding roll of web composed of a metal film and an aromatic polyimide composite film having a heat shrinkage ratio of more than 0.1% at 300° C., at a temperature between 150° C. and a glass transition temperature of the thermoplastic aromatic polyimide cover film, for a period of at least one minute.

20 Claims, No Drawings

ROLL OF METAL FILM/AROMATIC POLYIMIDE FILM COMPOSITE WEB

This application claims Paris Convention priority of two Japanese Patent Application Nos. 2000-088278 filed Mar. 28, 2000 and 2000-088279 filed Mar. 28, 2000.

FIELD OF THE INVENTION

The present invention relates to a roll of a web comprising metal film/aromatic polyimide composite film laminate.

BACKGROUND OF THE INVENTION

Aromatic polyimide films show good high temperature resistance, good chemical properties, high electrical insulating property, and high mechanical strength. Therefore, the aromatic polyimide film is widely employed in various technical fields. For instance, an aromatic polyimide film is favorably employed in the form of a continuous metal film/aromatic polyimide film composite web for manufacturing a flexible printed circuit board (FPC), a carrier tape for tape-automated-bonding (TAB), and a tape of lead-on-chip (LOC) structure.

A metal film/aromatic polyimide film composite sheet can be produced by bonding an aromatic polyimide film to a metal film using a conventional adhesive such as an epoxy resin. However, due to low heat-resistance of the conventional adhesive, the produced composite sheet cannot show satisfactorily high heat-resistance.

A metal film/aromatic polyimide film composite sheet also can be produced using a thermoplastic polyimide resin.

U.S. Pat. No. 4,543,295 describes a polyimide laminate which is produced by applying a pressure onto a laminated sheet composed of an aromatic polyimide film, a polyimide adhesive, and a metal film in vacuo.

From the viewpoint of industrial production, it is advantageous that the metal film/aromatic polyimide composite sheet is produced in the form of a continuous web by combining a continuous aromatic polyimide film with a continuous metal film using no adhesive. The continuous aromatic polyimide film web is generally produced by heating a continuous aromatic polyamide acid solution film to a high temperature, and the continuous film web is then wound on a core to give a roll of continuous film web. The continuous metal film/aromatic polyimide film web is generally produced by combining the continuous aromatic polyimide film web (which is drawn from the roll) and a continuous metal film web by means of, for instance, a combination of heating rolls.

As a result of the studies made by the present inventors, however, it has been noted that thus produced continuous metal film/aromatic polyimide film web shows poor thermal dimensional stability in the longitudinal direction (i.e., machine direction, MD) when it is cut to give sheets of predetermined dimensions and subjected to the conventional processing such as etching and heat treatment. The poor thermal dimensional stability is disadvantageous, particularly, for the use of the metal film/polyimide film composite sheet in the preparation of electronic parts.

SUMMARY OF THE INVENTION

It is an object of the invention to provide a metal film/aromatic polyimide film composite sheet having a high thermal dimensional stability.

As a result of the studies made by the present inventors, it has been discovered that the thermal dimensional stability of a metal film/aromatic polyimide film composite sheet obtained by cutting a continuous metal film/aromatic polyimide film composite web is enhanced by obtaining a roll of a continuous metal film/aromatic polyimide film composite web having a low heat shrinkage ratio in the longitudinal direction.

Accordingly, the present invention resides in a roll of an aromatic polyimide composite web comprising a non-thermoplastic aromatic polyimide base film and a thermoplastic aromatic polyimide cover film laminated on the base film, in which the polyimide composite web shows a heat shrinkage ratio of less than 0.1% at 300° C., in each of a longitudinal direction (or a machine direction: MD) and a width direction (or a traverse direction: TD).

The above-mentioned roll of an aromatic polyimide composite web can be favorably produced by a method which comprises heating a roll of an aromatic polyimide composite web comprising a non-thermoplastic aromatic polyimide base film and a thermoplastic aromatic polyimide cover film laminated on the base film, the polyimide composite web showing a heat shrinkage ratio of more than 0.1% at 300° C. in a longitudinal direction, at a temperature in the range between 150° C. and a glass transition temperature of the thermoplastic aromatic polyimide cover film, for a period of at least one minute.

The invention further resides in a roll of a web comprising an aromatic polyimide composite film and a metal film fixed to the composite film in which the polyimide composite film comprises a non-thermoplastic aromatic polyimide base film and a thermoplastic aromatic polyimide cover film laminated on the base film, the polyimide composite film showing a heat shrinkage ratio of less than 0.1% at 300° C.

The above-mentioned roll of a metal film/aromatic polyimide composite film web can be favorably produced by a method which comprises heating a roll of a web comprising an aromatic polyimide composite film and a metal film fixed to the composite film in which the polyimide composite film comprises a non-thermoplastic aromatic polyimide base film and a thermoplastic aromatic polyimide cover film laminated on the base film, the polyimide composite film showing a heat shrinkage ratio of more than 0.1% at 300° C. in a longitudinal direction, at a temperature in the range between 150° C. and a glass transition temperature of the thermoplastic aromatic polyimide cover film, for a period of at least one minute.

DETAILED DESCRIPTION OF THE INVENTION

The aromatic polyimide composite web of the invention comprises a non-thermoplastic aromatic polyimide base film and a thermoplastic aromatic polyimide cover film laminated on the base film. The thermoplastic polyimide cover film is preferably placed on each surface side of the non-thermoplastic aromatic polyimide base film. The web preferably has a width of 40 cm or larger.

On the thermoplastic aromatic polyimide cover film of the composite film, a metal film is fixed. If the composite film has a thermoplastic aromatic polyimide cover film on each surface side, a metal film is preferably fixed onto each cover film.

Examples of the metal films include copper films, stainless steel films, aluminum films, gold films, and metal alloy films. The metal film generally has a thickness of not larger than 70 $\mu$m, preferably 3 to 35 $\mu$m. The metal film preferably has a surface roughness (Rz) of 7 $\mu$m or less, more specifically 0.5 to 5 $\mu$m.

The aromatic polyimide composite film has a thermoplastic surface at least on the side to be brought into contact with the metal film.

The composite film preferably has a thickness of 7 to 125 μm, specifically 7 to 50 μm, and a linear expansion coefficient (in the MD-direction as well as in the TD direction) of not higher than $30 \times 10^{-6}$ cm/cm/°C., particularly $10 \times 10^{-6}$ to $25 \times 10^{-6}$ cm/cm/°C., in the temperature range of 50 to 200° C. A modules of tensile elasticity (in the MD direction, according to ASTM-D882) preferably is not less than 300 kg/mm$^2$.

The thermoplastic aromatic polyimide is preferably produced from the following combination of an aromatic tetracarboxylic dianhydride and an aromatic diamine compound:

(1) 2,3,3',4'-biphenyltetracarboxylic dianhydride and 1,3-bis(4-aminophenoxybenzene);

(2) a combination of 2,3,3',4'-biphenyltetracarboxylic dianhydride and 4,4'-oxydiphthalic dianhydride and 1,3-bis(4-aminophenoxy)-2,2-dimethylpropane; or (3) a combination of pyromellitic dianhydride and 4,4'-oxydiphthalic dianhydride and 1,3-bis(4-aminophenoxybenzene).

The thermoplastic polyimide film (or layer) can be prepared from a dope solution containing an aromatic polyamide acid in an organic solvent, which is produced from one of the combinations of the aromatic tetracarboxylic dianhydride(s) and diamine compound(s) by a reaction in an organic solvent at a temperature of 100° C. or lower, particularly at a temperature of 20 to 60° C.

Alternatively, the thermoplastic polyimide film can be formed using a solution of thermoplastic polyimide which is produced by heating the polyamide acid at a temperature of 150 to 250° C., or heating the polyamide acid at a temperature of lower than 150° C., particularly 15 to 50° C., in the presence of an imidizing agent, to give the desired polyimide in the solution; removing the solvent by evaporation or precipitating the polyimide in a bad solvent, to give a polyimide powder; and then dissolving the polyimide powder in an appropriate solvent.

In preparing the polyamide acid for the formation of a thermoplastic polyimide film layer, relatively small amounts of other aromatic tetracarboxylic dianhydrides and/or diamine compounds may be incorporated, in addition to the aromatic tetracarboxylic dianhydrides and diamine compounds, provided that no essential change of characteristics is brought about into the obtainable thermoplastic polyimide. Examples of the optionally employable aromatic tetracarboxylic dianhydrides include 3,3',4,4'-biphenyltetracarboxylic dianhydride, 2,2-bis(3,4-dicarboxyphenyl)propane dianhydride, and 2, 3, 6, 7-naphthalenetetracarboxylic dianhydride.

Examples of the optionally employable diamine compounds include aromatic diamines which have a flexible molecular structure and contain plural benzene rings, such as 4,4'-diaminodiphenyl ether, 4,4'-diaminobenzophenone, 4,4'-diaminodiphenylmethane, 2,2-bis(4-aminophenyl) propane, 1,4-bis(4-aminophenoxy)benzene, 4,4'-bis(4-aminophenyl)diphenyl ether, 4,4'-bis(4-aminophenyl) diphenylmethane, 4,4'-bis(4-aminophenoxy)diphenyl ether, 4,4'-bis(4-aminophenoxy)diphenylmethane, 2,2-bis-[4-(aminophenoxy)phenyl]propane, and 2,2-bis[4-(4-aminophenoxy)phenyl]hexafluoropropane; aliphatic amines, such as 1,4-diaminobutane, 1,6-diaminohexane, 1,8-diaminooctane, 1,4-diaminodecane, and 1,12-diaminododecane; and diaminosiloxanes, such as bis(3-aminopropyl)tetramethyldisiloxane. The optionally employable aromatic diamine compound can be employed in an amount of 20 molar % or less, particularly 10 mol. % or less, per the total amount of the diamine compounds. The optionally employable aliphatic diamine or diaminosiloxane can be employed in an amount of 20 molar % or less, per the total amount of the diamine compounds.

In the preparation of the thermoplastic aromatic polyimide, a dicarboxylic anhydride such as phthalic anhydride or its derivative, hexahydrophthalic anhydride or its derivative, or succinic anhydride or its derivative can be incorporated so as to cap the amine terminal of the resulting aromatic polyimide.

In the preparation of the polyamide acid for the production of the thermoplastic polyimide layer, the diamine compound and the carboxylic anhydride compound (which includes a tetracarboxylic dianhydride and a dicarboxylic anhydride) are used in a molar ratio of 0.92:1 to 1.1:1, particularly 0.98:1 to 1.1:1, more particularly 0.99:1 to 1.1:1 in terms of the molar amount of the amino group and the molar amount of the carboxylic anhydride (i.e., the molar amount of the tetracarboxylic dianhydride, and the molar amount of the dicarboxylic anhydride, if it is used in combination). The dicarboxylic anhydride is preferably employed in a molar amount of 0.05 or less, based of one molar amount of the tetracarboxylic dianhydride.

Further, a gelation-inhibiting agent such as a phosphorus-containing stabilizer (e.g., triphenyl phosphite, or triphenyl phosphate) may be employed in the process of polymerization of the polyamide acid in an amount of 0.01 to 1%, based on the amount of the polyamide acid. Also, an imidizing agent such as a basic organic catalyst (e.g., imidazole, 2-imidazole, 1,2-dimethylimidazole, or 2-phenylimidazole) may be added to the dope solution (i.e., polyamide acid solution) in an amount of 0.05 to 10 wt. %, particularly 0.1 to 2 wt. %, based on the amount of the polyamide acid. The imidizing agent is effective to well imidize the polyamide acid at a relatively low temperature.

In addition, a metal compound such as an organic aluminum compound (e.g., aluminum triacetylacetonate), an inorganic aluminum compound (e.g., aluminum hydroxide), or an organic tin compound may be incorporated into the dope solution in an amount of 1 ppm or more (in terms of the amount of metal), particularly 1 to 1,000 ppm, based on the amount of the polyamide acid, so that the thermoplastic polyimide layer can be bonded to a metal film at a higher bonding strength.

The preparation of the polyamide acid can be performed in an organic solvent such as N-methyl-2-pyrrolidone, N,N-dimethylformamide, N, N-dimethylacetamide, N, N-diethylacetamide, dimethylsulfoxide, hexamethylphosphoramide, N-methylcaprolactam, or cresol or its derivative.

The non-thermoplastic polyimide base film preferably has no detectable glass transition temperature or has a glass transition temperature of higher than 350° C.

The non-thermoplastic polyimide base film preferably has a linear expansion coefficient (in the MD direction as well as in the TD direction) of $5 \times 10^{-6}$ to $25 \times 10^{-6}$ cm/cm/°C., in the temperature range of 50 to 200° C. A modules of tensile elasticity (in the machine direction, MD, according to ASTM-D882) preferably is not less than 300 kg/mm$^2$.

The non-thermoplastic polyimide base film is composed of polyimide which is preferably produced from the following combination of a tetracarboxylic dianhydride and a diamine compound:

(1) 3,3',4,4'-biphenyltetracarboxylic dianhydride (s-BPDA) and p-phenylenediamine (PPD);

(2) 3,3',4,4'-biphenyltetracarboxylic dianhydride and a combination of p-phenylenediamine (PPD) and 4,4'-diaminodiphenyl ether (DADE), in which a molar ratio in terms of PPD/DADE preferably is more than 85/15;

(3) a combination of 3,3',4,4'-biphenyltetracarboxylic dianhydride and pyromellitic dianhydride and a combination of p-phenylenediamine and 4,4'-diaminodiphenyl ether;

(4) pyromellitic dianhydride and a combination of p-phenylenediamine (PPD) and 4,4'-diaminodiphenyl ether (DADE), in which a molar ratio in terms of PPD/DADE preferably is within 90/10 and 10/90; or (5) a combination of 3,3',4,4'-benzophenonetetracarboxylic dianhydride (BTDA) and pyromellitic dianhydride (PMDA) and a combination of p-phenylenediamine (PPD) and 4,4'-diaminodiphenyl ether (DADE), in which a molar ratio in terms of BTDA/PMDA preferably is within 20/80 and 90/10, and a molar ratio in terms of PPD/DADE preferably is within 30/70 and 90/10.

The possible employment of other tetracarboxylic dianhydride and diamine compounds, addition of various additives, the conditions of the preparation of thermoplastic polyimide described hereinbefore can be applied to the preparation of the non-thermoplastic polyimide base film.

The multi-layered aromatic polyimide composite film can be advantageously produced by known co-extrusion/cast methods, in which one or two solutions of a precursor of thermoplastic polyimide and a solution of non-thermoplastic polyimide are simultaneously extruded from a dye having plural slits and overlaid one on another on a temporary support such as a continuous belt. The overlaid solution films are dried and then heated to produce the desired multi-layered film having the thermoplastic polyimide layer/non-thermoplastic polyimide layer structure, or the thermoplastic polyimide layer/non-thermoplastic polyimide layer/thermoplastic polyimide layer.

Alternatively, the multi-layered polyimide composite film can be produced by placing a semi-dried solution film of a precursor of thermoplastic polyimide on a semi-dried solution film of a precursor of non-thermoplastic polyimide and heating the semi-dried films to give a multi-layered polyimide composite film.

Examples of the temporary supports include a stainless mirror surface and a stainless belt. The cast solutions are then heated on the temporary support to a temperature of 100 to 200° C., so as to give a self-supporting semi-cured film or a self-supporting film containing a small amount of a solvent.

The three-layered solution film of polyamide acid and/or polyimide produced by the simultaneous casting is dried by heating and then further heated to a temperature between the glass transition temperature (Tg) and the decomposition temperature of the polyimide for the thermoplastic polyimide layer, preferably at a temperature of 250 to 420° C. (surface temperature measured by means of a surface thermometer), preferably for a period of 1 to 60 minutes. Thus produced three-layered aromatic polyimide composite film has a structure of thermoplastic polyimide layer/polyimide base film/thermoplastic polyimide layer.

The simultaneous casting is favorably employed because it gives the composite film with less thermal deterioration.

The thermoplastic polyimide preferably has a glass transition temperature (Tg) of 190 to 280° C., particularly 200 to 275° C. The thermoplastic polyimide preferably does not melt at temperatures between its Tg and 300° C., and preferably shows a modulus of elasticity of 0.001 to 0.5 time at 275° C., based on a modulus of elasticity measured at 50° C.

The non-thermoplastic polyimide base film preferably has a thickness of 5 to 120 $\mu$m, and the thermoplastic polyimide film layer preferably has a thickness of 1 to 25 $\mu$m (preferably 2 to 10 $\mu$m, more preferably 2 to 8 $\mu$m), while the composite film has a thickness of 7 to 125 $\mu$m. In the polyimide composite film, the base film preferably has a thickness of 7.5 to 96%, particularly 15 to 90%, based on the total thickness of the composite film.

The invention further provides a metal film/polyimide composite film/metal film laminate web.

Examples of the metal films for attachment to the polyimide composite film include copper film, aluminum film, iron film, gold film, or a film of metal alloy. Preferred are an electrolytic copper film and a rolled copper film. The metal film preferably has a surface roughness (Rz) of 7 $\mu$m or less, more preferably 0.5 to 5 $\mu$m. A metal film having such surface roughness is available under the name of VLP or LP (or HTE) for a copper film. There is no limitation with respect to the thickness of the metal film, but a thickness of not larger than 70 $\mu$m, particularly 5 to 35 $\mu$m, is preferred.

The metal film/aromatic polyimide film/metal film laminate is preferably produced by pressing under heating a three layer structure of a metal film—aromatic polyimide composite film—metal film using a heating roll or a double belt press.

The double belt press is preferably employed for the procedure of pressing the laminate under heating. A representative double belt press is described in U.S. Pat. No. 4,599,128, and is commercially available from Held Corporation (Germany).

The roll of an aromatic polyimide composite web of the invention which comprises a non-thermoplastic aromatic polyimide base film and a thermoplastic aromatic polyimide cover film laminated on the base film and which shows a low heat shrinkage ratio such as a ratio of less than 0.1% at 300° C. in each of a longitudinal direction and a width direction can be produced by heating a roll of an aromatic polyimide composite web comprising a non-thermoplastic aromatic polyimide base film and a thermoplastic aromatic polyimide cover film laminated on the base film, the polyimide composite web showing a heat shrinkage ratio of more than 0.1% at 300° C. in a longitudinal direction, at a temperature in the range of 150° C. to a glass transition temperature of the thermoplastic aromatic polyimide cover film, typically at a temperature of 200 to 350° C., for a period of at least one minute, preferably 1 to 180 minutes.

The roll of a metal film/aromatic polyimide composite film web of the invention can be favorably produced by heating a roll of a web comprising an aromatic polyimide composite film and a metal film fixed to the composite film in which the polyimide composite film comprises a non-thermoplastic aromatic polyimide base film and a thermoplastic aromatic polyimide cover film laminated on the base film, the polyimide composite film showing a heat shrinkage ratio of more than 0.1% at 300° C. in a longitudinal direction, at a temperature in the range of 150° C. to a glass transition temperature of the thermoplastic aromatic polyimide cover film, typically at a temperature of 200 to 350° C., for a period of at least one minute, preferably 1 to 180 minutes.

The roll of a metal film/aromatic polyimide composite film web of the invention can show such a high thermal dimensional stability of ±0.07% or less, which is determined by the process in that the sheet is subjected to an etching procedure at 43° C. to remove the metal film using an aqueous ferric chloride solution and subsequently to a heat treatment at 250° C. for 30 min.

The invention is further described by the following examples.

In the following examples, the physical and chemical characteristics were determined by the methods described below:

Heat shrinkage ratio: measuring dimensional change (in MD direction, %) of a polyimide sheet after heating it at 300° C. for 2 hours.

Thermal dimensional stability: determined by the process in that the sheet is subjected to an etching procedure at 43° C. using an aqueous ferric chloride solution and subsequently to a heat treatment at 250° C. for 30 min.

Glass transition temperature (Tg): determined by means of a viscoelastometer;

Linear expansion coefficient (cm/cm/°C.): during 50 and 200° C., measured at 5°/min. (average value in MD and TD directions);

Adhesion strength: 90° peal strength;

Electric characteristics: evaluated by measuring a volume resistance according to ASTM D257

Total evaluation:
AA: high dimensional stability, 90° C. peeling strength of >1.0 kg/cm, satisfactory volume resistance, good appearance
BB: low dimensional stability

[Preparation of Thermoplastic Three-Layered Polyimide Substrate Film]

(1) Preparation of Dope for Thermoplastic Polyimide

In a reaction vessel equipped with a stirrer and a nitrogen gas inlet were successively placed N-methylpyrrolidone, a mixture of 1,3-bis(4-aminophenoxy)benzene and 2,3,3',4'-biphenyltetracarboxylic dianhydride [1000:1000, molar ratio, in an amount to give a solution containing the mixture at 22 wt. %], and triphenylphosphate (0.1 wt. % per the amount of the above-mentioned mixture). The resulting mixture was kept at 25° C. for one hour under stirring, to give a dope having a solution viscosity of approx. 2,000 poise (at 25° C.).

(2) Preparation of Dope for Non-Thermoplastic Polyimide

In a reaction vessel equipped with a stirrer and a nitrogen gas inlet were successively placed N-methylpyrrolidone and a mixture of p-phenylenediamine and 3,3',4,4'-biphenyltetracarboxylic dianhydride [1000:988, molar ratio, in an amount to give a solution containing the mixture at 18 wt. %]. The resulting mixture was kept at 50° C. for 3 hrs. under stirring, to give a viscous brown dope having a solution viscosity of approx. 1,500 poise (at 25° C.).

(3) Production of Three-Layered Polyimide Composite Film

The dope for thermoplastic polyimide and the dope for non-thermoplastic polyimide were simultaneously extruded onto a continuous metal belt from a manifold die having three slits under the condition that both dopes were extruded to give a three-layered structure of dope for thermoplastic polyimide/dope for non-thermoplastic polyimide/dope for thermoplastic polyimide. The resulting dope solution films were continuously dried by air (heated to 140° C.), until the solution films were solidified and united. The united films were separated from the metal belt and heated in a heating furnace at gradually increased temperatures of 200° C. to 320° C. In the course of heating, the solvent was evaporated and imidization was performed. Thus produced continuous three-layered polyimide composite film web (width: approx. 53 cm) was wound around a roll.

The three-layered polyimide composite film had a total thickness of 25 $\mu$m (4 $\mu$m/17 $\mu$m/4 $\mu$m), a mean linear expansion coefficient of between $10 \times 10^{-6}$ cm/cm/°C. and $25 \times 10^{-6}$ cm/cm/°C. (at 50–200° C.). The non-thermoplastic polyimide of the center layer had no glass transition temperature at temperatures of lower than 400° C., while the thermoplastic polyimide on both sides had a glass transition temperature of 250° C.

EXAMPLE 1

The roll of a continuous three-layered polyimide composite film web produced in (3) above was heated at 200° C. for 60 minutes for annealing. From thus annealed roll of the web, a sample sheet was cut off. The sample sheet was subjected to procedures for determining a volume resistance and a heat shrinkage ratio. The results are set forth below:

Volume resistance: $>1 \times 10^{15} \Omega \cdot cm$

Heat shrinkage ratio: 0.08%

The annealed polyimide web was drawn from the roll and placed between a pair of electrolytic copper film (3EC-VLP, Rz: 3.8 $\mu$m, thickness: 18 $\mu$m). Thus produced three-layered structure was supplied into a double belt press. In the double belt press, it was preheated, pressed at a temperature set to 380° C. (maximum), and cooled to 117° C., to produce a metal film/polyimide composite film/metal film laminate.

From the laminate, a sample sheet was obtained and subjected to a procedure for determining thermal dimensional stability in which the sample sheet was etched and heated. The results are set forth below:

Thermal dimensional stability: –0.06%

Total evaluation: AA

[Comparison Example 1]

From the roll of a continuous three-layered polyimide composite film web produced above (having been subjected to no annealing procedure), a sample sheet was cut off. The sample sheet was subjected to procedures for determining a volume resistance and a heat shrinkage ratio. The results are set forth below:

Volume resistance: $>1 \times 10^{15} \Omega \cdot cm$

Heat shrinkage ratio: 0.40%

The polyimide composite film web was sandwitched between a pair of metal films in the same manner as in Example 1, to give a metal film/polyimide composite film/metal film laminate web.

From the laminate web, a sample sheet was obtained and subjected to a procedure for determining thermal dimensional stability in which the sample sheet was etched and heated. The results are set forth below:

Thermal dimensional stability: –0.14%

Total evaluation: BB

EXAMPLE 2

The aforementioned process for the production of three-layered polyimide composite film was repeated to produce a roll of a three-layered polyimide composite film web having thicknesses of 5 $\mu$m/15 $\mu$m/5 $\mu$m.

The roll was heated at 200° C. for 60 minutes for annealing. From thus annealed roll of the web, a sample sheet was cut off. The sample sheet was subjected to procedures for determining a heat shrinkage ratio. The result is set forth below:

Heat shrinkage ratio: 0.04%

The polyimide composite film web was sandwitched between a pair of metal films in the same manner as in Example 1, to give a metal film/polyimide composite film/metal film laminate web.

From the laminate web, a sample sheet was obtained and subjected to a procedure for determining thermal dimensional stability in which the sample sheet was etched and heated. The results are set forth below:

Thermal dimensional stability: −0.06%

Total evaluation: AA

[Comparison Example 2]

A sample sheet was prepared from the roll produced in Example 2 (which had not been subjected to the annealing procedure) was determined in its heat shrinkage ratio. The result is set forth below:

Heat shrinkage ratio: 0.20%

EXAMPLE 3

The aforementioned process for the production of three-layered polyimide composite film was repeated to produce a roll of a three-layered polyimide composite film web having thicknesses of 3 μm/9 μm/3 μm or 2 μm/6 μm/2 μm.

The roll was heated at 200° C. for 60 minutes for annealing. From thus annealed roll of the web, a sample sheet was cut off. The sample sheet was subjected to procedures for determining a heat shrinkage ratio. The result is set forth below:

Heat shrinkage ratio: 0.04% (both composite films)

EXAMPLE 4

The continuous three-layered polyimide composite film web (produced in (3) Production of three-layered polyimide composite film) was drawn from the roll and placed between a pair of electrolytic copper film (3EC-VLP, Rz: 3.8 μm, thickness: 18 μm). Thus produced three-layered structure was supplied into a double belt press. In the double belt press, it was preheated, pressed at a temperature set to 380° C. (maximum), and cooled to 117° C., to produce a metal film/polyimide composite film/metal film laminate. The laminate was then wound to give a laminate roll.

The laminate roll was heated at 200° C. for 60 minutes for annealing. From thus annealed laminate roll, a sample sheet was cut off, and subjected to a procedure for determining thermal dimensional stability in which the sample sheet was etched and heated. The results are set forth below:

Thermal dimensional stability: −0.06%

Total evaluation: AA

[Comparison Example 3]

A sample sheet was prepared from the laminate roll of Example 4 (which had not been subjected to the annealing procedure) was determined in its thermal dimensional sta-bility.heat shrinkage ratio. The results are set forth below:

Thermal dimensional stability: −0.11%

Total evaluation: BB

EXAMPLE 5

The laminate roll prepared in Example 4 was heated at 300° C. for 60 minutes for annealing. From thus annealed laminate roll, a sample sheet was cut off, and subjected to a procedure for determining thermal dimensional stability in which the sample sheet was etched and heated. The results are set forth below:

Thermal dimensional stability: −0.04%

Total evaluation: AA

EXAMPLE 5

The laminate film web of Example 4 was drawn from the roll and wound around an aluminum core. Thus prepared roll was heated at 260° C. for 60 minutes for annealing. From thus annealed laminate roll, a sample sheet was cut off, and subjected to a procedure for determining thermal dimensional stability in which the sample sheet was etched and heated. The results are set forth below:

Thermal dimensional stability: −0.05%

Total evaluation: AA

EXAMPLE 6

The laminate film web of Example 4 was drawn from the roll and wound around a stainless steel (SUS) core. Thus prepared roll was heated at 260° C. for 60 minutes for annealing. From thus annealed laminate roll, a sample sheet was cut off, and subjected to a procedure for determining thermal dimensional stability in which the sample sheet was etched and heated. The results are set forth below:

Thermal dimensional stability: −0.06%

Total evaluation: AA

What is claimed is:

1. A roll of an aromatic polyimide composite web comprising a non-thermoplastic aromatic polyimide base film and a thermoplastic aromatic polyimide cover film laminated on the base film, in which the polyimide composite web shows a heat shrinkage ratio of less than 0.1% when it is heated at 300° C. for 2 hours in each of a longitudinal direction and a width direction.

2. The roll of claim 1, wherein the web has the thermoplastic aromatic polyimide cover film laminated on each surface of the base film.

3. The roll of claim 1, wherein the web has a width of 40 cm or larger.

4. The roll of claim 1, wherein the web has a thickness of 7 to 50 μm.

5. The roll of claim 1, wherein the non-thermoplastic polyimide base film has no detectable glass transition temperature or has a glass transition temperature of higher than 350° C.

6. The roll of claim 5, wherein the non-thermoplastic polyimide base film comprises polyimide which is produced from the following combination of a tetracarboxylic dianhydride and a diamine compound:

(1) 3,3',4,4'-biphenyltetracarboxylic dianhydride and p-phenylenediamine;

(2) 3,3',4,4'-biphenyltetracarboxylic dianhydride and a combination of p-phenylenediamine and 4,4'-diaminodiphenyl ether;

(3) a combination of 3,3',4,4'-biphenyltetracarboxylic dianhydride and pyromellitic dianhydride and a combination of p-phenylenediamine and 4,4'-diaminodiphenyl ether;

(4) pyromellitic dianhydride and a combination of p-phenylenediamine and 4,4'-diaminodiphenyl ether; or (5) a combination of 3,3',4,4'-benzophenonetetracarboxylic dianhydride and pyromellitic dianhydride and a combination of p-phenylenediamine and 4,4'-diaminodiphenyl ether.

7. The roll of claim 1, wherein the thermoplastic polyimide cover film has a glass transition temperature in the range of 180 to 275° C.

8. The roll of claim 7, wherein the thermoplastic polyimide cover film comprises polyimide which is produced from the following combination of a tetracarboxylic dianhydride and a diamine compound:

(1) 2,3,3',4'-biphenyltetracarboxylic dianhydride and 1,3-bis(4-aminophenoxybenzene);

(2) a combination of 2,3,3',4'-biphenyltetracarboxylic dianhydride and 4,4'-oxydiphthalic dianhydride and 1,3-bis(4-aminophenoxy)-2,2-dimethylpropane; or (3) a combination of pyromellitic dianhydride and 4,4'-oxydiphthalic dianhydride and 1,3-bis(4-aminophenoxybenzene).

9. A method of producing a roll of claim 1, which comprises heating a roll of an aromatic polyimide composite web comprising a non-thermoplastic aromatic polyimide base film and a thermoplastic aromatic polyimide cover film laminated on the base film, the polyimide composite web showing a heat shrinkage ratio of more than 0.1% at 300° C. in a longitudinal direction, at a temperature in the range of 150° C. to a glass transition temperature of the thermoplastic aromatic polyimide cover film, for a period of at least one minute.

10. A roll of a web comprising an aromatic polyimide composite film and a metal film fixed to the composite film in which the polyimide composite film comprises a non-thermoplastic aromatic polyimide base film and a thermoplastic aromatic polyimide cover film laminated on the base film, the polyimide composite film showing a heat shrinkage ratio of less than 0.1% when it is heated at 300° C. for 2 hours.

11. The roll of claim 10, wherein the web has a thermoplastic aromatic polyimide cover film laminated on each surface of the base film, and the metal film is fixed to each of the cover film.

12. The roll of claim 10, wherein the web has a width of 40 cm or larger.

13. The roll of claim 10, wherein the polyimide composite film has a thickness of 7 to 50 μm, and the metal film has a thickness of 3 to 35 μm.

14. The roll of claim 10, wherein the non-thermoplastic polyimide base film has no detectable glass transition temperature or has a glass transition temperature of higher than 350° C.

15. The roll of claim 14, wherein the non-thermoplastic polyimide base film comprises polyimide which is produced from the following combination of a tetracarboxylic dianhydride and a diamine compound:

(1) 3,3',4,4'-biphenyltetracarboxylic dianhydride and p-phenylenediamine;

(2) 3,3',4,4'-biphenyltetracarboxylic dianhydride and a combination of p-phenylenediamine and 4,4'-diaminodiphenyl ether;

(3) a combination of 3,3',4,4'-biphenyltetracarboxylic dianhydride and pyromellitic dianhydride and a combination of p-phenylenediamine and 4,4'-diaminodiphenyl ether;

(4) pyromellitic dianhydride and a combination of p-phenylenediamine and 4,4'-diaminodiphenyl ether; or (5) a combination of 3,3',4,4'-benzophenonetetracarboxylic dianhydride and pyromellitic dianhydride and a combination of p-phenylenediamine and 4,4'-diaminodiphenyl ether.

16. The roll of claim 10, wherein the thermoplastic polyimide cover film has a glass transition temperature in the range of 180 to 275° C.

17. The roll of claim 16, wherein the thermoplastic polyimide cover film comprises polyimide which is produced from the following combination of a tetracarboxylic dianhydride and a diamine compound:

(1) 2,3,3',4'-biphenyltetracarboxylic dianhydride and 1,3-bis(4-aminophenoxybenzene);

(2) a combination of 2,3,3',4'-biphenyltetracarboxylic dianhydride and 4,4'-oxydiphthalic dianhydride and 1,3-bis(4-aminophenoxy)-2,2-dimethylpropane; or (3) a combination of pyromellitic dianhydride and 4,4'-oxydiphthalic dianhydride and 1,3-bis(4-aminophenoxybenzene).

18. The roll of claim 10, wherein a sheet obtained by cutting the web comprising an aromatic polyimide composite film and a metal film fixed to the composite film has a thermal dimensional stability within +0.07% and −0.07%, which is determined by the process in that the sheet is subjected to an etching procedure at 43° C. using an aqueous ferric chloride solution and subsequently to a heat treatment at 250° C. for 30 min.

19. A method of producing a roll of claim 10, which comprises heating a roll of a web comprising an aromatic polyimide composite film and a metal film fixed to the composite film in which the polyimide composite film comprises a non-thermoplastic aromatic polyimide base film and a thermoplastic aromatic polyimide cover film laminated on the base film, the polyimide composite film showing a heat shrinkage ratio of more than 0.1% at 300° C. in a longitudinal direction, at a temperature in the range of 150° C. to a glass transition temperature of the thermoplastic aromatic polyimide cover film, for a period of at least one minute.

20. The method of claim 19, wherein the roll to be heated has been prepared by pressing the metal film on the polyimide composite film using a double belt press.

\* \* \* \* \*